United States Patent
Ebe et al.

(10) Patent No.: US 6,447,850 B1
(45) Date of Patent: Sep. 10, 2002

(54) POLYCRYSTALLINE SILICON THIN FILM FORMING METHOD

(75) Inventors: Akinori Ebe; Naoto Kuratani; Eiji Takahashi, all of Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 09/581,519

(22) PCT Filed: Oct. 18, 1999

(86) PCT No.: PCT/JP99/05762

§ 371 (c)(1),
(2), (4) Date: Aug. 22, 2000

(87) PCT Pub. No.: WO00/25354

PCT Pub. Date: May 4, 2000

(30) Foreign Application Priority Data

Oct. 23, 1998 (JP) .............................. 10-302986
Aug. 11, 1999 (JP) .............................. 11-227388

(51) Int. Cl.$^7$ ................................. H05C 1/00
(52) U.S. Cl. ...................... 427/573; 427/294; 427/314; 427/574; 427/578; 427/580
(58) Field of Search ................. 427/573, 574, 427/578, 580, 314, 294

(56) References Cited

FOREIGN PATENT DOCUMENTS

| JP | 06097079 | 4/1994 |
|---|---|---|
| JP | 06177043 | 6/1994 |
| JP | 08031747 | 2/1996 |
| JP | 10265212 | 10/1998 |

Primary Examiner—Bernard Pianalto
(74) Attorney, Agent, or Firm—Arent Fox Kintner Plotkin & Kahn

(57) ABSTRACT

A method of forming a thin polycrystalline silicon film and a thin film forming apparatus allowing inexpensive formation of a thin polycrystalline silicon film at a relatively low temperature with high productivity. More specifically, a method of forming a thin polycrystalline silicon film and a thin film forming apparatus in which a state of plasma is controlled to achieve an emission intensity ratio of hydrogen atom radicals (Hβ) of one or more to the emission intensity of SiH* radicals in the plasma. The thin film forming apparatus of a plasma CVD type includes a deposition chamber accommodating a deposition target substrate, a discharging electrode for plasma formation connected to a discharging power source, a gas supply device for supplying a gas and an exhaust device, and further includes an emission-spectrometer and a probe measuring device as well as a control portion for controlling at least one of the power supply, the gas supply and gas exhausting, for maintaining a desired state of plasma based on information detected by them.

13 Claims, 7 Drawing Sheets

POLYCRYSTALLINE SILICON THIN FILM FORMING METHOD

TECHNICAL FIELD

The present invention relates to a method of forming a thin polycrystalline silicon film by a plasma CVD method as well as a thin film forming apparatus which can be used for forming a thin polycrystalline silicon film.

BACKGROUND ART

Thin silicon films have been used as a material for TFT (thin film transistor) switches arranged in pixels of liquid crystal displays, and have also been used for producing those such as various kinds of integrated circuits and solar batteries.

The thin silicon films are formed by a plasma CVD method using silane-containing reaction gases in many cases. Most of such thin films are thin amorphous silicon films.

A thin amorphous silicon film can be formed on a film deposition substrate which is kept at a relatively low temperature, and the thin film having a large area can be easily formed in a plasma of a material gas produced by radio-frequency discharging (frequency: 13.56 MHz) using electrodes of a parallel plate type. Owing to the above, the thin amorphous silicon films have been widely used in switching devices for pixels of liquid crystal displays, solar batteries and the like.

However, an electric power generation efficiency of a solar battery using a silicon film as well as characteristics such as a response speed of a semiconductor device using a silicon film cannot further be improved as long as an amorphous silicon film is used. Accordingly, it has been studied to utilize a thin crystalline silicon film such as a thin polycrystalline silicon film.

A thin crystalline silicon film such as a thin polycrystalline silicon film can be formed by various methods, in which a film deposition substrate is kept at a temperature from 600° C. to 700° C. , such as CVD methods (e.g., a low pressure plasma CVD method and a thermal CVD method), and PVD methods such as a vacuum vapor deposition method and a sputtering vapor deposition method. Also, the film may be formed, first by forming a thin amorphous silicon film at a relatively low temperature by a method selected from various kinds of CVD and PVD methods, followed then by a post-treatment of effecting a thermal treatment at about 800° C. or more, or of effecting a thermal treatment at about 600° C. for a long time.

Such a method is also known that laser annealing is effected on an amorphous silicon film for crystallizing it.

According to a method in which a substrate is subjected to a high temperature, however, it is necessary to employ an expensive substrate which can withstand a high temperature. For example, it is difficult to form a thin crystalline silicon film on an inexpensive glass substrate having a low melting point (and a heat resistance temperature of 500° C. or less). Accordingly, a thin crystalline silicon film such as a thin polycrystalline silicon film requires a high manufacturing cost.

According to a laser annealing method, a thin crystalline silicon film can be produced at a low temperature. However, a laser emitting step is required, and laser light must be emitted with an extremely high energy density. For those and other reasons, a manufacturing cost of a thin crystalline silicon film becomes high.

Accordingly, an object of the invention is to provide a method of manufacturing a thin polycrystalline silicon film at a relatively low temperature with a low cost and a high productivity.

It is also an object of the invention to provide a thin film forming apparatus, which can manufacture a thin polycrystalline silicon film at a relatively low temperature with a low cost and a high productivity, and can furthermore be widely utilized for forming a desired thin film.

DISCLOSURE OF THE INVENTION

For achieving the above objects, the inventors made studies, and obtained the following knowledge:

A gas mixture, supplied into a film deposition chamber, of a material gas having silicon atoms [e.g., a silicon tetrafluoride ($SiF_4$) gas or a silicon tetrachloride ($SiCl_4$) gas] and a hydrogen gas or a silane-containing reaction gas [e.g., a mono-silane ($SiH_4$) gas, a disilane ($Si_2H_6$) gas or a trisilane ($Si_3H_g$) gas], supplied into a film deposition chamber, is decomposed by plasma formation so that a large number of decomposition products (various radicals or ions) are formed. Among the decomposition products, $SiH_3^*$, $SiH_2^*$, $SiH^*$ and the like are the radicals that contribute to formation of a thin silicon film. The structure of the film, decided in the process of growth of the thin silicon film, depends on a surface reaction on a substrate. It is considered that film deposition occurs as a result of reaction between uncombined hands of silicon atoms present on the substrate surface and the radicals. For crystallizing the thin silicon film, it is necessary to suppress as much as possible such a situation that silicon atoms having uncombined hands or hydrogen atoms combined with silicon atoms are taken into the film. For that, it is considered important to increase the covering rate of hydrogen atoms over the substrate surface and over the film surface formed thereon. Detailed mechanism is unknown on how hydrogen atoms covering the substrate surface and the film surface formed thereon suppress those such as hydrogen atoms combined with silicon atoms having uncombined hands taken into the film. However, it is considered that the uncombined hands of silicon atoms are sufficiently combined with hydrogen causing vaporization of them. In summary, increase in the covering rate of hydrogen atoms over the substrate surface reduces silicon atoms having uncombined hands as well as hydrogen atoms combined with silicon atoms-taken into the substrate. For increasing the covering rate of hydrogen atoms over the substrate surface, it is essential that hydrogen atom radicals are always emitted from a plasma to the substrate. For this, it is important to increase the density of hydrogen atom radicals in the plasma. According to studies by the inventors, a thin polycrystalline silicon film of good quality can be formed by increasing the density of hydrogen atom radicals so that the ratio of an emission intensity of hydrogen atom radicals ($H\beta$) to an emission intensity of $SiH^*$ radicals in the plasma, [i.e., (emission intensity of hydrogen atom radicals ($H\beta$))/(emission intensity of $SiH^*$ radicals)] may be one or more.

The invention is based on the above knowledge, and provides a thin polycrystalline silicon film forming method and a thin film forming apparatus described below.

(1) Thin Polycrystalline Silicon Film Forming Method

A method of forming a thin polycrystalline silicon film, in which a plasma is formed from a gas mixture of a material gas having silicon atoms and a hydrogen gas, or from a silane-containing reaction gas, the state of the plasma is controlled to provide an emission intensity of hydrogen atom radicals (Hβ) in the plasma exhibiting a ratio of one or more to an emission intensity of SiH* radicals, and a thin polycrystalline silicon film is formed on a substrate in the plasma.

(2) Thin Film Forming Apparatus

A thin film forming apparatus of a plasma CVD type including a film deposition chamber for accommodating a deposition target substrate; a discharging electrode for plasma formation, in the film deposition chamber, connected to a discharging power source; a gas supply device for supplying a gas into the deposition chamber for film deposition; and an exhaust device for exhausting a gas from the deposition chamber, wherein the apparatus further includes an emission-spectrometer and a probe measuring device for measuring the plasma state, and a control portion for controlling at least one of a power supply from the discharging power source (typically, a magnitude of the supplied power), a gas supply from the gas supply device (typically, a supplied gas flow rate) and exhausting by the exhaust device for maintaining a predetermined plasma state based on information detected from the emission-spectrometer and the probe measuring device.

PREFERRED EMBODIMENTS FOR IMPLEMENTING THE INVENTION

Figure 1:
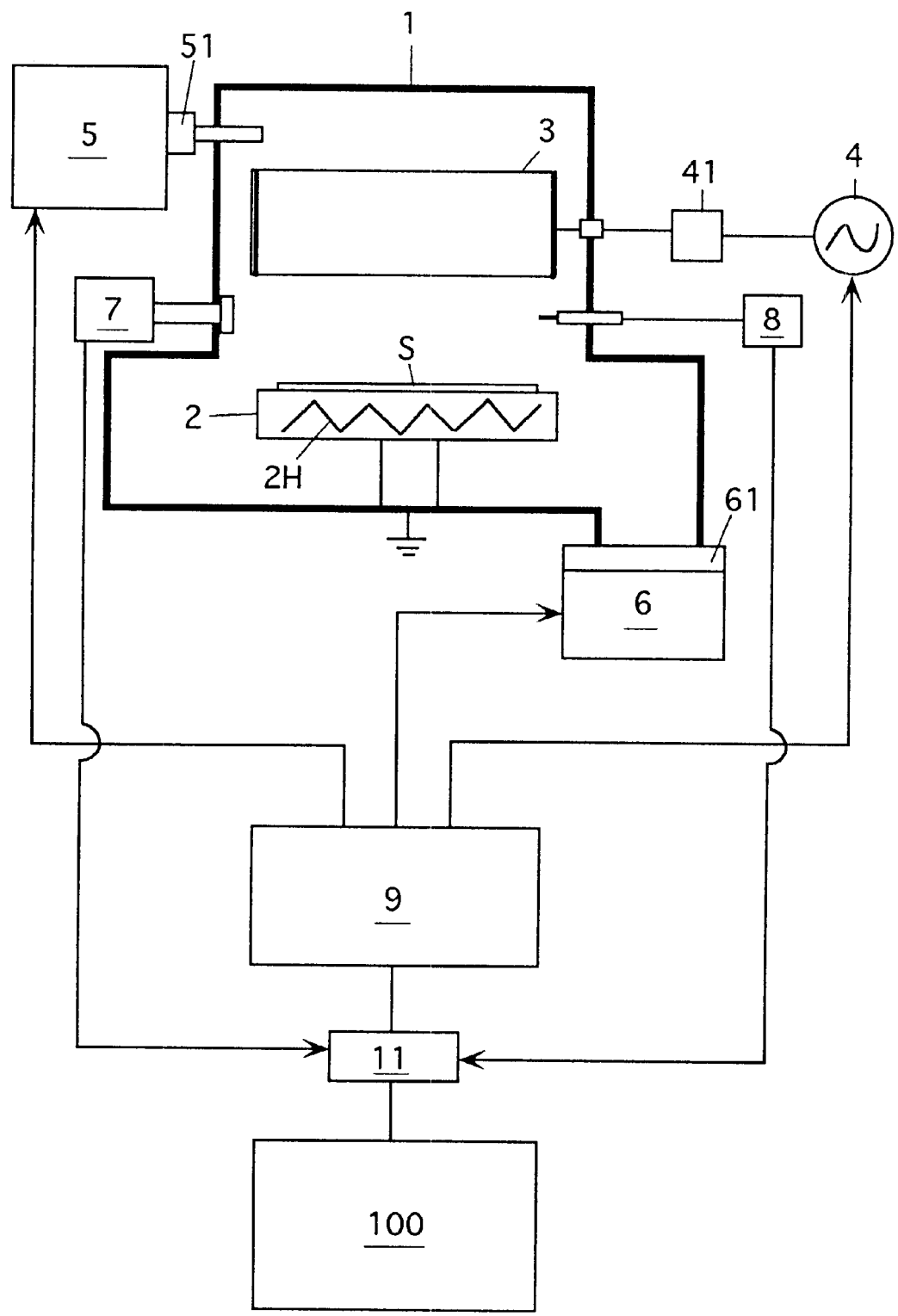
FIG. 1 shows a schematic structure of an example of the thin film forming apparatus according to the invention.

Preferred embodiments of the method of manufacturing a thin polycrystalline silicon film and the thin film forming apparatus according to the invention are as follows;

(1) Method of forming a thin polycrystalline silicon film

A plasma is formed from a gas mixture of a material gas having silicon atoms and a hydrogen gas, or from a silane-containing reaction gas. A state of the plasma is controlled to provide an emission intensity of hydrogen atom radicals (Hβ) in the plasma exhibiting a ratio of one or more to an emission intensity of SiH* radicals. A thin polycrystalline silicon film is formed on a substrate in the plasma.

According to this thin polycrystalline silicon film manufacturing method, a thin polycrystalline silicon film of good quality is obtained with high productivity without a thermal post-treatment nor laser annealing required in the prior art.

According to the thin polycrystalline silicon film manufacturing method, the thin polycrystalline silicon film can be formed on a substrate at a low temperature of 400° C. or lower. Accordingly, the substrate may be of an inexpensive substrate having a low thermal resistance such as an inexpensive glass substrate having a low-melting point (heat-resistant temperature of 500° C. or lower). Thereby, the thin polycrystalline silicon film can be manufactured at a low cost, and therefore a liquid crystal display, a solar battery and various semiconductor devices utilizing the thin silicon films can be provided at a low cost.

The material gas having the silicon atoms may be, e.g., a silicon tetrafluoride ($SiF_4$) gas or a silicon tetrachloride ($SiCl_4$) gas, and a silane-containing reaction gas may be a gas, e.g., of mono-silane ($SiH_4$), disilane ($Si_2H_6$) or trisilane ($Si_3H_4$).

A plasma state is controlled so that the ratio of an emission intensity of hydrogen atom radicals (Hβ) to an emission intensity of SiH* radicals in the plasma, i.e., (emission intensity of hydrogen atom radicals (Hβ))/(emission intensity of SiH* radicals) (hereafter referred to as Hβ/SiH*) may be equal to one or more. For this control, the state of gas dissociation is measured by emission spectroscopy, and thereby the plasma state is controlled so that the emission intensity of hydrogen atom radicals Hβ (emersion of 486 nm) may provide a ratio of one or more to the emission intensity of SiH* (emersion of 414 nm) which is one kind of radicals contributing to formation of the thin silicon film.

The upper limit of Hβ/SiH* can be large in a range not impeding formation of the thin polycrystalline silicon film, and is not particularly restricted. However, although not restricted to this, the upper limit may be usually equal to about 20 or less for preventing unpreferable ions from increasing, which is described later.

Control of the plasma state can specifically be performed by controlling at least one of a magnitude of the supplied electric power for plasma formation, a flow rate of the gas supplied into a deposition chamber, a deposition gas pressure in the deposition chamber and the like.

For example, increase in supplied power (wattage) promotes gas decomposition. However, excessive increase in supplied power results in unignorable increase in ions. A lower deposition gas pressure reduces ions, but it also reduces hydrogen atom radicals. For example, in the case of employing a gas mixture of a material gas having silicon atoms and a hydrogen gas, increase in amount of a supplied hydrogen gas can increase the hydrogen atom radicals while suppressing increase in ions. In view of the above, a plasma is controlled to attain a desired plasma state by appropriately controlling one or more of the magnitude of the supplied power, the flow rate of the gas supplied into a deposition chamber, the deposition gas pressure in the deposition ch amber and the like.

When forming a thin polycrystalline silicon film, ions in the plasma are moved together with the radicals to the surface of the substrate as well as to the surfac e of the film being formed. However, increase in amount of injected ions damages the film being formed, and impedes silicon crystallization. The injection energy of the ions injected from the plasma into the substrate surface is affected by the plasma potential, and is given by a difference between the plasma potential and the substrate surface potential. According to studies by the inventors, ion injection in to the substrate can be suppressed to a large extent by setting the plasma potential at 60 V or less. The number of injected ions can also be reduced by controlling the plasma to reduce the density of ions produced in the plasma.

For controlling the plasma, the plasma potential may be controlled to be equal to 60 V or less. Instead of this, or in addition to this, the plasma control may be performed to provide the ion density of $5 \times 10^{10}$ (cm$^{-3}$) or less in the plasma.

The lower limit of the plasma potential is not particularly restricted unless it impedes formation of a thin polycrystalline silicon film, and may be, for example, although not restricted to this, equal to about 10 V or more for obtaining the state allowing stable maintaining of the plasma.

It is preferable to decrease the density of ions produced in the plasma within a range not impeding formation of a thin polycrystalline silicon film. For maintaining the stable plasma, it may be, for example, although not restricted to this, equal to about $1 \times 10^8$ (cm$^{-3}$) or more.

Typically, plasma formation can be performed in a discharged situation, in which case plasma formation using a cylindrical electrode as the discharging electrode is more preferable than plasma formation using a parallel plated electrode structure, i.e., a conventional structure, because the former can achieve more efficient gas decomposition, and allows easy formation of plasma providing the emission intensity ratio (Hβ/SiH*) of 1 or more. This is because the supplied gas must be decomposed efficiently for increasing the density of the hydrogen atom radicals in the plasma to the extent providing the emission intensity ratio (Hβ/SiH*) of 1 or more, and gas decomposition is caused by collision in the plasma of fast electrons with gas molecules. Electrons in the plasma, subject to changes of applied voltage, move between the electrodes, colliding with gas molecules. Accordingly, a conventional parallel plate type electrode structure cannot sufficiently promote gas decomposition because the distance between the electrodes is short, and electrons moving between the electrodes do not so often collide with gas molecules. In contrast to this, a cylindrical discharging electrode can decompose a gas efficiently by employing, as an opposed electrode, e.g., an inner wall of a deposition chamber or a substrate holder at the same potential as the wall, and thereby increasing the distance between the electrodes to increase the number of times of collision of moving electrons with gas molecules. In the case of employing a cylindrical discharging electrode, it is arranged such that the center axis of the cylindrical form of the cylindrical discharging electrode is perpendicular or substantially perpendicular to the substrate surface.

Typically, plasma formation can be performed in a discharged situation, in which case a discharging power source used for discharging for plasma formation may be a radio-frequency power source of 13.56 MHz which has been generally used in the prior art. However, as the frequency increases, electrons move more frequently per a unit time between electrodes, and gas decomposition occurs more efficiently. Therefore, the emission intensity ratio (Hβ/SiH*) can be easily increased by using a radio-frequency power source of, e.g., 60 MHz or more.

Accordingly, plasma may be formed by discharging, and a cylindrical electrode may be used as a discharging electrode for discharging. In addition to, or instead of this, the discharging power source used for discharging may be a radio-frequency power source of the frequency of 60 MHz or more.

In the case where a radio-frequency power source of a frequency of 60 MHz or more is used, the upper limit of the frequency is not particularly restricted unless it impedes formation of a thin polycrystalline silicon film. However, there is a tendency that an excessively high frequency restricts a plasma generation region. Therefore, it may be substantially of the order of microwaves (typically, 2.45 GHz).

Hydrogen atom radicals produced by gas decomposition have a short lifetime, and parts of them reach a substrate. However, the majority of them are recombined with neighboring hydrogen atom radicals or radicals of, e.g., SiH$_3$*, SiH$_2$* or SiH*. Therefore, it is desired that the gas pressure during film deposition is low for suppressing such a situation that the hydrogen atom radicals meet other radicals during movement to a substrate. By employing the gas pressure of 20 m Torr or less, and more preferably, of 10 m Torr or less, rather than the general deposition pressure range from hundreds of milli-torrs to several torrs, produced hydrogen atom radicals can efficiently reach a substrate.

Accordingly, the deposition gas pressure may be equal to 20 m Torr or less, or may be equal 10 m Torr or less. The lower limit of the deposition gas pressure is not particularly restricted unless it impedes formation of a thin polycrystalline silicon film. It is preferably about 0.1 m Torr or higher for smooth production and the like of plasma.

The substrate temperature during film deposition can be kept at or below 400° C. The lower limit of the substrate temperature during deposition is not particularly restricted unless it impedes formation of a thin polycrystalline silicon film. Usually, the substrate temperature is substantially equal to or higher than a room or an ambient temperature around the film forming apparatus.

A description is now given again of the case relating to formation of a thin polycrystalline silicon film on a substrate, and more specifically, of the case where a substrate is disposed in a deposition chamber, the internal pressure of the deposition chamber is lowered to the deposition gas pressure by exhausting a gas therefrom, and plasma is formed by applying a radio-frequency power to the deposition material gas, which is supplied into the deposition chamber, and is formed of a gas mixture of a material gas having silicon atoms and a hydrogen gas, or a silane-containing reaction gas. In this case of thin polycrystalline silicon film formation, for example, the emission intensity ratio (Hβ/SiH*) is set at 1 or more, and the plasma potential Vp is set at 60 V or less in the following manner.

When the emission intensity ratio is smaller than 1, and the plasma potential is equal to 60 V or less, the radio-frequency power is increased. When the emission ratio is equal to 1 or more, and the plasma potential is larger than 60, the degree of exhausting of the gas from the deposition chamber is controlled to increase the deposition gas pressure. When the emission intensity ratio is smaller than 1, and the plasma potential is larger than 60 V, the amount of the material gas supplied into the deposition chamber is reduced. In these manners, the conditions of the emission intensity of 1 or more and the plasma potential of 60 V or less are attained. Some or all of these adjustment manners may be successively executed.

If the radio-frequency power is increased when the emission intensity ratio is smaller than 1 and the plasma potential is 60 V or less, the degree of dissociation increases, and the emission intensity ratio rises so that the emission intensity ratio changes toward 1 or more without a change in plasma potential of 60 V or less.

When the amount of the gas exhausted from the deposition chamber is adjusted to increase the deposition gas pressure when the emission intensity ratio is 1 or more, and the plasma potential is larger than 60 V, energy supply from electric fields of respective ions decreases due to decrease in average free path so that the plasma potential changes toward 60 V or less without causing a change in the emission intensity ratio of 1 or more.

When the emission intensity ratio is smaller than 1 and the plasma potential is larger than 60 V, the amount of the material gas supplied into the deposition chamber may be decreased. Then, no longer is there lack of energy supplied to gas molecules due to excessive gas supply, and the emission intensity ratio changes toward 1 or more. Thereafter, the plasma potential may still be larger than 60 V. Then, the deposition gas pressure may be increased.

Control of the plasma state may be performed to attain the ion density of the plasma not exceeding $5\times10^{10}$ (cm$^{-3}$) for forming a thin polycrystalline silicon film.

Application of the radio-frequency power to the deposition material gas may be performed by employing a cylindrical discharging electrode connected to the radio-frequency power source.

Application of the radio-frequency power to the deposition material gas may be performed by employing a radio-frequency power of the frequency of 60 MHz or more.

The deposition gas pressure may be kept at or below 20 m Torr.

The substrate temperature during film deposition may be kept at or below 400° C.

(2) Thin Film Forming Apparatus

A thin film forming apparatus of a plasma CVD type including a film deposition chamber for accommodating a deposition target substrate; a discharging electrode for plasma formation, in the film deposition chamber, connected to a discharging power source; a gas supply device for supplying a gas into the deposition chamber for film deposition; and an exhaust device for exhausting a gas from the deposition chamber, wherein the apparatus further includes an emission-spectrometer and a probe measuring device for measuring the plasma state, and a control portion for controlling at least one of a power supply from the discharging power source (typically, a magnitude of the supplied power), a gas supply from the gas supply device (typically, a supplied gas flow rate) and exhausting by the exhaust device for maintaining a predetermined plasma state based on information detected from the emission-spectrometer and the probe measuring device.

According to this thin film forming apparatus, a deposition target substrate is disposed in a predetermined position in the deposition chamber. The exhaust device operates to exhaust a gas from the deposition chamber. A gas for film deposition is supplied from the gas supply device, and discharging is performed from the discharging electrode to produce plasma from the gas thus supplied so that a film is formed on the substrate in the plasma. In this operation, the control portion, operating based on information detected at the emission-spectrometer and the probe measuring device, controls at least one of the electric power supply from the discharging power source, the gas supply from the gas supply device and exhausting by the exhaust device (control of gas supply from the gas supply device and of exhausting by the exhaust device leads to control of the deposition gas pressure) so that the desired thin film can be formed.

For example, the gas supply device may be arranged to supply a gas mixture of a material gas having silicon atoms [e.g., a silicon tetrafluoride (SiF$_4$) gas or a silicon tetrachloride (SiCl$_4$) gas] and a hydrogen gas, or a silane-containing reaction gas [e.g., a mono-silane (SiH$_4$) gas, a disilane (Si$_2$H$_6$) gas or a trisilane (Si$_3$H$_4$) gas]. Further, the control portion may be arranged to control at least one of the power supply from the discharging electrode, the gas supply from the gas supply device and exhausting by the exhaust device, so that hydrogen atom radicals (Hβ) in the plasma in the deposition chamber may provide a desired emission intensity ratio to the emission intensity of SiH* radicals according the emission-spectrometer, or the plasma potential detected by the probe measuring device may exhibit a predetermined value, and thereby a predetermined thin silicon film (having a predetermined crystallinity and the like) may be formed on the substrate.

More specifically, for forming a thin polycrystalline silicon film on a substrate, the gas supply device may be arranged to supply a material gas having silicon atoms and a hydrogen gas, or a silane-containing reaction gas, and the control portion may be arranged to control at least one of the power supply from the discharging power source, the gas supply from the gas supply device and exhausting by the exhaust device so that hydrogen atom radicals (Hβ) in the plasma in the deposition chamber may exhibit the emission intensity ratio of 1 or more to the emission intensity of SiH* radicals according to the emission-spectrometer.

Alternatively, for forming a thin polycrystalline silicon film on a substrate, the gas supply device may be arranged to supply a material gas having silicon atoms and a hydrogen gas, or a silane-containing reaction gas, and the control portion may be arranged to control at least one of the power supply from the discharging power source, the gas supply from the gas supply device and exhausting by the exhaust device so that hydrogen atom radicals (Hβ) in the plasma in the deposition chamber may exhibit the emission intensity ratio of 1 or more to the emission intensity of SiH* radicals according to the emission-spectrometer, and the plasma potential measured by the probe measuring device may not exceed 60 V. In this apparatus, the lower limit of the plasma potential is not particularly restricted unless it impedes formation of a thin polycrystalline silicon film, but may be equal to about 10 V or more for stable maintaining or the like of the plasma, although not restricted to it.

In the latter case where control is performed to provide the emission intensity ratio of 1 or more, and the plasma potential of 60 V or less, the discharging power source is formed of a radio-frequency power source, and the control portion is arranged to provide the emission intensity ratio of 1 or more, and the plasma potential of 60 V or l ess in the following manner. When the emission intensity ratio is smaller than 1, and the plasma potential is 60 V or less, the radio-frequency power source is controlled to increase the power supplied therefrom. When the emission intensity ratio is 1 or more, and the plasma potential is larger than 60 V, the exhaust device is controlled to adjust the amount of the gas exhausted from the deposition chamber for increasing the deposition gas pressure in the deposition chamber. When the emission intensity ratio is smaller than 1, and the plasma potential is larger than 60 V, the gas supply device may be controlled to reduce the amount of the gas supplied into the deposition chamber.

In any one of the foregoing thin film forming apparatuses for forming the thin polycrystalline silicon films, the upper limit of Hβ/SiH* can be large in a range not impeding formation of the thin polycrystalline silicon film, and is not particularly restricted as already described. However, the upper limit may be equal to about 20 or less for preventing increase of unpreferable ions, which is to be described later, although not restricted to it.

According to the thin film forming apparatus for forming the thin polycrystalline silicon film, the thin polycrystalline silicon film of good quality can be formed with high productivity without performing a thermal post-treatment and laser annealing required in the prior art.

The thin polycrystalline silicon film can be formed on a substrate at a low temperature of 400° C. or lower. Accordingly, the substrate may be an inexpensive substrate having a low thermal resistance such as an inexpensive glass substrate having a low-melting point (heat-resistant temperature of 500° C. or lower). Thereby, the thin polycrystalline silicon film can be manufactured at a low cost, and therefore a liquid crystal display, a solar battery and various semiconductor devices utilizing the thin silicon films can be provided at a low cost.

In the case where the thin film forming apparatus is used for forming the thin polycrystalline silicon film, the thin film forming apparatus may have the following structures for the same reasons as those already described in connection with the method of forming the thin polycrystalline silicon film. The thin film forming apparatus may employ two or more of the following features (a)–(d) in combination unless a problem arises.

(a) The thin film forming apparatus for forming the thin polycrystalline silicon film, wherein the control portion controls at least one of the power supply from the discharging power source, the gas supply from the gas supply device and exhausting by the exhaust device so that the ion density of the plasma measured by the probe measuring device may exhibit a value of $5\times10^{10}$ ($cm^{-3}$) or less.

It is preferable to lower the density of ions produced in the plasma within a range not impeding formation of the thin polycrystalline silicon film, and the density may be equal to, e.g., about $1\times10^8$ ($cm^{-3}$) or more from a viewpoint of, e.g., stable maintenance the plasma, although not restricted to it.

(b) The thin film forming apparatus for forming the thin polycrystalline silicon film, wherein the discharging electrode is a cylindrical electrode.

(c) The thin film forming apparatus for forming the thin polycrystalline silicon film, wherein the discharging power source is a power source supplying a power of a frequency of 60 MHz or more.

The upper limit of the frequency of the discharging power source is not particularly restricted unless it impedes formation of the thin polycrystalline silicon film. However, there is a tendency that an excessively high frequency restricts a plasma generation region. Therefore, it may be substantially of the order of microwaves (typically, 2.45 GHz).

(d) The thin film forming apparatus for forming the thin polycrystalline silicon film, wherein the control portion controls at least one of the gas supply from the gas supply device and exhausting by the exhaust device for maintaining the deposition gas pressure at 20 m Torr or less, or at 10 m Torr or less.

The lower limit of the deposition gas pressure is not particularly restricted unless it impedes formation of the thin polycrystalline silicon film, but is preferably equal to about 0.1 m Torr or more for smooth production and the like of the plasma.

More specific embodiments of the invention are described below with reference to the drawings.

FIG. 1 shows a schematic structure of an example of the thin film forming apparatus according to the invention.

The thin film forming apparatus shown in FIG. 1 includes a deposition chamber (plasma producing chamber) 1, a substrate holder 2 disposed in the chamber 1, a cylindrical discharging electrode 3 arranged in the chamber 1 and located above the substrate holder 2, a discharging radio-frequency power source 4 (i.e., a radio-frequency power source for discharging) connected to the discharging electrode 3 via a matching box 41, a gas supply device 5 for supplying a gas for film deposition into the deposition chamber, an exhaust device 6 connected to the deposition chamber for exhausting a gas from the deposition chamber, an emission-spectrometer 7 and a probe measuring device 8 for measuring a state of a plasma formed in the deposition chamber, and a control portion 9 which controls at least one of the power supplied from the power source 4, the gas supply from the gas supply device and the deposition pressure in the deposition chamber based on information detected at the emission-spectrometer 7 and at the probe measuring device 8 for obtaining a predetermined plasma state. All of these components operate in accordance with instructions sent from a host computer 100. In the figure, "11" indicates an intermediate hub device for governing the transmission and reception of signals.

The substrate holder 2 includes a heater 2H for heating the substrate.

The cylindrical discharging electrode 3 is disposed such that the center axis of its cylindrical form intersects substantially perpendicularly the central portion of a deposition target substrate S disposed on the substrate holder 2.

The power source 4 is a variable power source controlled by an instruction from the control portion 9, and can supply a radio-frequency power of a frequency of 60 MHz.

Both the deposition chamber 1 and the substrate holder 2 are grounded.

The gas supply device 5 in this embodiment can supply a mono-silane ($SiH_4$) gas, and includes a gas source of $SiH_4$ as well as a valve (not shown), a mass-flow controller 51 and the like. The mass-flow controller 51 controls a flow rate in accordance with an instruction from the control portion 9.

The exhaust device 6 includes an exhausting pump as well as a valve (a conductance valve in this embodiment) 61 and the like. The valve controls the exhausted gas flow rate in accordance with an instruction from the control portion 9.

The emission-spectrometer 7 can detect the emission spectra of products produced by gas decomposition for determining the ratio (Hβ/SiH*) of the emission intensity of the hydrogen atom radicals (Hβ) to the emission intensity of the SiH* radicals.

Hβ/SiH* is obtained by the following formula in view of the sensitivity calibration of the device:

Emission intensity ratio (Hβ/SiH*)=(Ib×αb)/(Ia×αa)

Ia: emission intensity of SiH* (414 nm)

αa: calibration factor of 414 nm in the device

Ib: emission intensity of Hβ (486 nm)

αb: calibration factor of 486 nm in the device

The probe measuring device 8 is a device for measuring the plasma state by a Langmuir probe. The probe measuring device 8 can detect voltage/current characteristics in the plasma, and can calculate from the detected characteristics the plasma potential, ion density, electron density and electron temperature.

Figure 2:
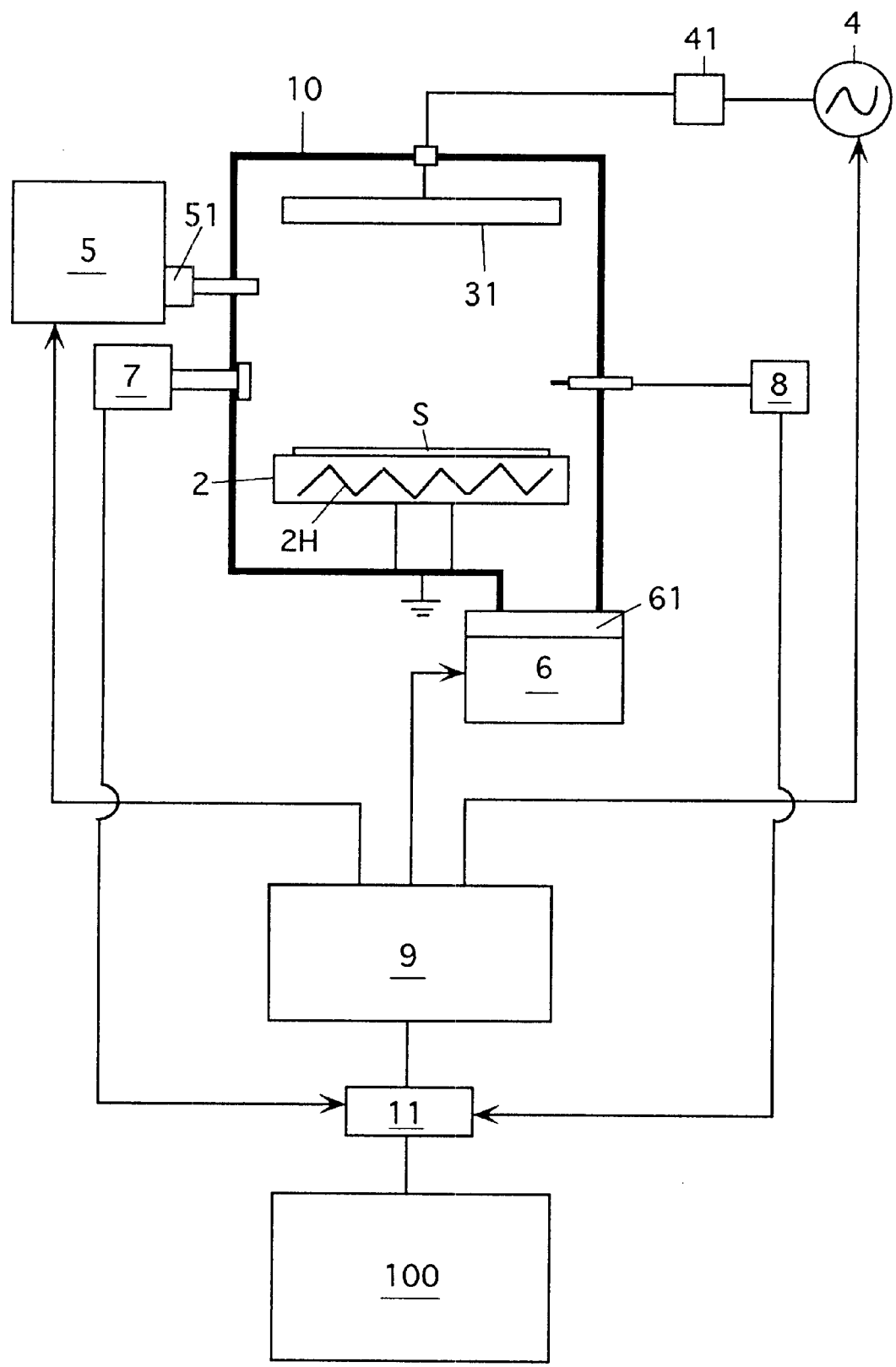
FIG. 2 shows a schematic structure of another example of the thin film forming apparatus according to the invention.

FIG. 2 shows a schematic structure of another example of the thin film forming apparatus according to the invention.

The thin film forming apparatus shown in FIG. 2 is a plasma CVD device of a parallel plated electrode structure, and includes a deposition chamber (plasma producing chamber) 10, the substrate holder 2 which is disposed in the chamber 10, is kept at the ground potential and is provided with the heater 2H, a plate-type discharging electrode 31 disposed in the chamber 10 and located above the substrate holder 2, the discharging radio-frequency power source 4 connected to the discharging electrode 31 via the matching box 41, the gas supply device 5 for supplying the gas for film deposition into the deposition chamber, the exhaust device 6 connected to the deposition chamber for exhausting the gas from the deposition chamber, the emission-spectrometer 7 and the probe measuring device 8 for measuring the plasma state produced in the deposition chamber, and the control portion 9 which controls at least one of the power supplied from the power source 4, the gas supply from the gas supply device 5 and the deposition pressure in the deposition chamber based on information detected at the emission-spectrometer 7 and at the probe measuring device 8 for obtaining the predetermined plasma state. All of these components operate in accordance with instructions from the host computer 100. In the figure, "11" indicates the intermediate hub device for governing the transmission and reception of the signals.

This apparatus is identical with that shown in FIG. 1 except for forms of the deposition chamber (plasma producing chamber) 10 and the discharging electrode 31.

In either of the thin film forming apparatuses shown in FIGS. 1 and 2, the deposition target substrate S is arranged on the substrate holder 2 in the deposition chamber, and is heated to a predetermined temperature, if necessary. The exhaust device 6 operates to exhaust a gas from the deposition chamber while supplying a mono-silane gas from the gas supply device 5 into the deposition chamber. A plasma is produced from the gas thus supplied by performing discharging from the discharging electrode 3 (31) so that a film is formed on the substrate S in the plasma thus produced. In this operation, the control portion 9 controls at least one of the magnitude of the electric power supplied from the discharging power source 4, the amount of the gas supplied from the gas supply device 5 and the deposition pressure set by adjusting the gas supply rate and/or the exhaust amount by the exhaust device 6. The control portion 9 performs the above control for providing a predetermined emission intensity ratio of hydrogen atom radicals (Hβ) to an emission intensity of SiH* radicals in the plasma in the deposition chamber according to measurement by the emission-spectrometer 7, or for further providing a predetermined plasma potential detected at the probe measuring device 8. A predetermined thin silicon film (having a predetermined crystallinity and the like) can thus be formed on the substrate S.

In particular, the control portion 9 controls at least one of the magnitude of the electric power supplied from the discharging power source 4, the amount of the gas supplied from the gas supply device 5 and the deposition pressure set by adjusting the gas supply amount and/or the exhaust amount by the exhaust device 6 so that the emission intensity of hydrogen atom radicals (Hβ) may exhibit a ratio of 1 or more to the emission intensity of SiH* radicals in the plasma in the deposition chamber according to measurement by the emission-spectrometer 7, or further that the plasma potential detected at the probe measuring device 8 may not exceed 60 V. Thereby, a thin polycrystalline silicon film can be formed on the substrate S at the substrate temperature of 400° C. or less with high productivity.

For more smooth forming of a thin polycrystalline silicon film of high quality, the following may further be employed.

(a) The control portion 9 controls at least one of the magnitude of the power supplied from the discharging power source 4, the amount of the gas supplied from the gas supply device 5 and the deposition pressure by adjusting the gas supply amount and/or the exhaust amount by the exhaust device 6 so that the ion density in the plasma may exhibit a value of $5 \times 10^{10}$ ($cm^{-3}$) or less.

(b) The control portion 9 controls the amount of the gas supplied from the gas supply device 5 and/or the amount of the gas exhausted by the exhaust device 6 so that the deposition gas pressure may not exceed 20 m Torr and, more preferably, may not exceed 10 m Torr.

Experimental examples of formation of thin silicon films are described.

EXPERIMENTAL EXAMPLE 1

A glass substrate was disposed on the substrate holder 2 of the apparatus using the cylindrical electrode 3 shown in FIG. 1, and the exhaust device 6 exhausted a gas from the deposition chamber 1 to attain a pressure of $2 \times 10^{-6}$ Torr. Then, the exhausting operation was continued, and simultaneously the gas supply device 5 supplied 5 sccm of mono-silane gas ($SiH_4$). Further, the power source 4 applied a radio-frequency of 60 MHz and 200 W to the cylindrical electrode 3 to cause discharging in the deposition chamber 1. Thereby, the plasma was formed from the deposition gas, and a thin silicon film of 500 Å was formed on the glass substrate. During this formation, the deposition gas pressure was kept at 2.0 m Torr, and the substrate temperature was kept at 400° C.

The crystallinity of the thin silicon film thus formed was evaluated by a laser Raman spectroscopy, and it was confirmed that a thin polycrystalline silicon film was formed. In the above Raman spectroscopy, peaks of the crystalline silicon (Raman shift=515–520 $cm^{-1}$) were detected with respect to the structure (Raman shift=480 $cm^{-1}$) of the amorphous silicon formed by a conventional plasma CVD method, and thereby the crystallinity was confirmed. The crystallinity evaluation which for the following examples is the same as the foregoing evaluation in the Raman spectroscopy.

Figure 3:
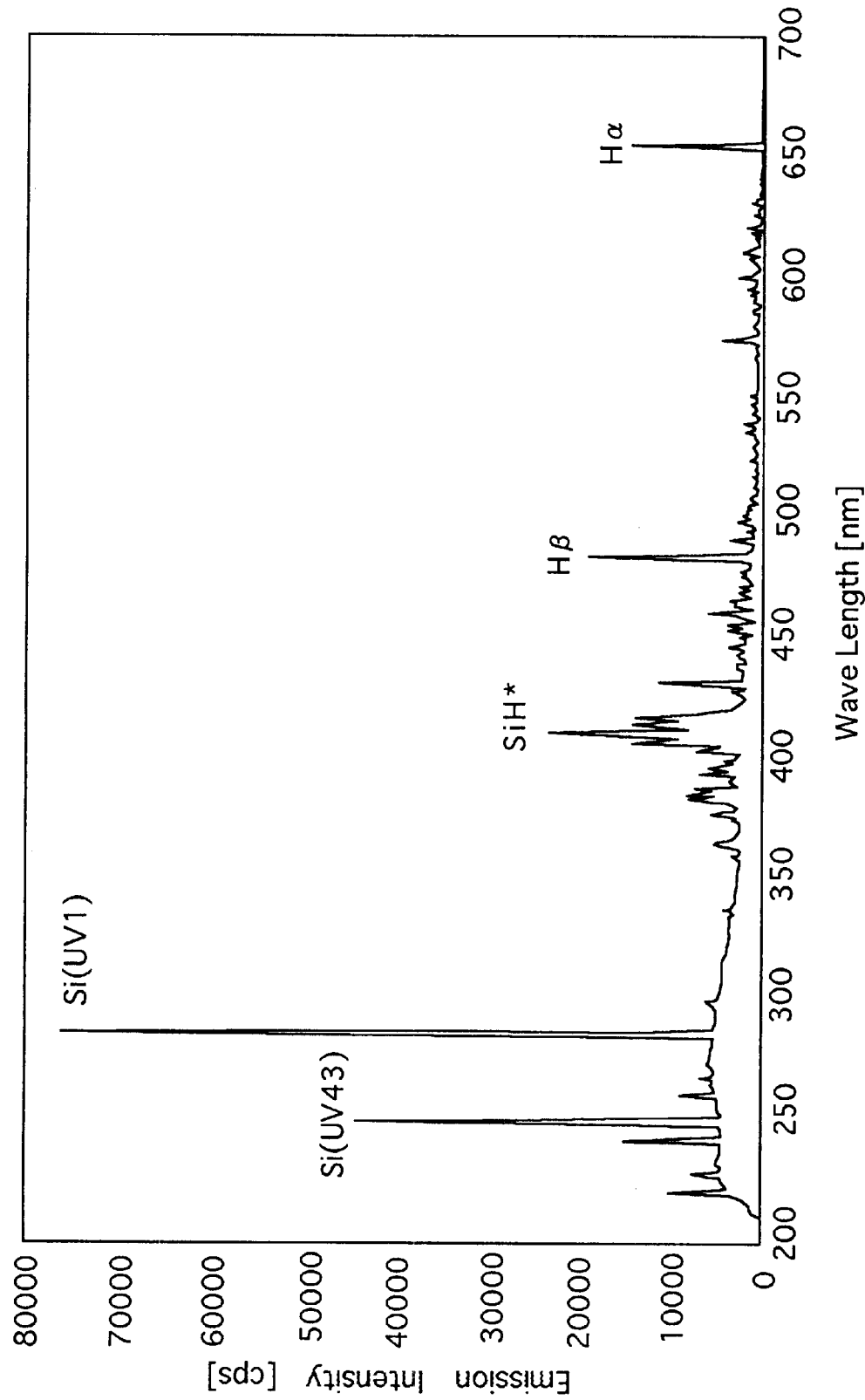
FIG. 3 shows an emission spectrum of $SiH_4$ plasma in the experimental example 1 of the apparatus shown in FIG. 1 with an $SiH_4$ supply amount of 10 ccm and a discharging power of 200 W.

FIG. 3 shows emission spectra of the $SiH_4$ plasma with the $SiH_4$ supply amount of 5 ccm and the discharging electric power of 200 W. FIG. 3 shows emission spectra corresponding to products produced by gas decomposition, and more specifically shows that the SiH* contributing to silicon deposition emitted the light of 414 nm, hydrogen atom radicals (HE) emitted the light of 486 nm, and a large number of and SiH* and hydrogen atom radicals were present in the plasma.

The emission intensity ratio (Hβ/SiH*) between the emission intensity of hydrogen atom radicals (HP) and the emission intensity of SiH* radicals (414 nm) was 1.10 (αa: 0.0145, αb: 0.0167), according to the emission-spectrometer 7.

Figure 4:
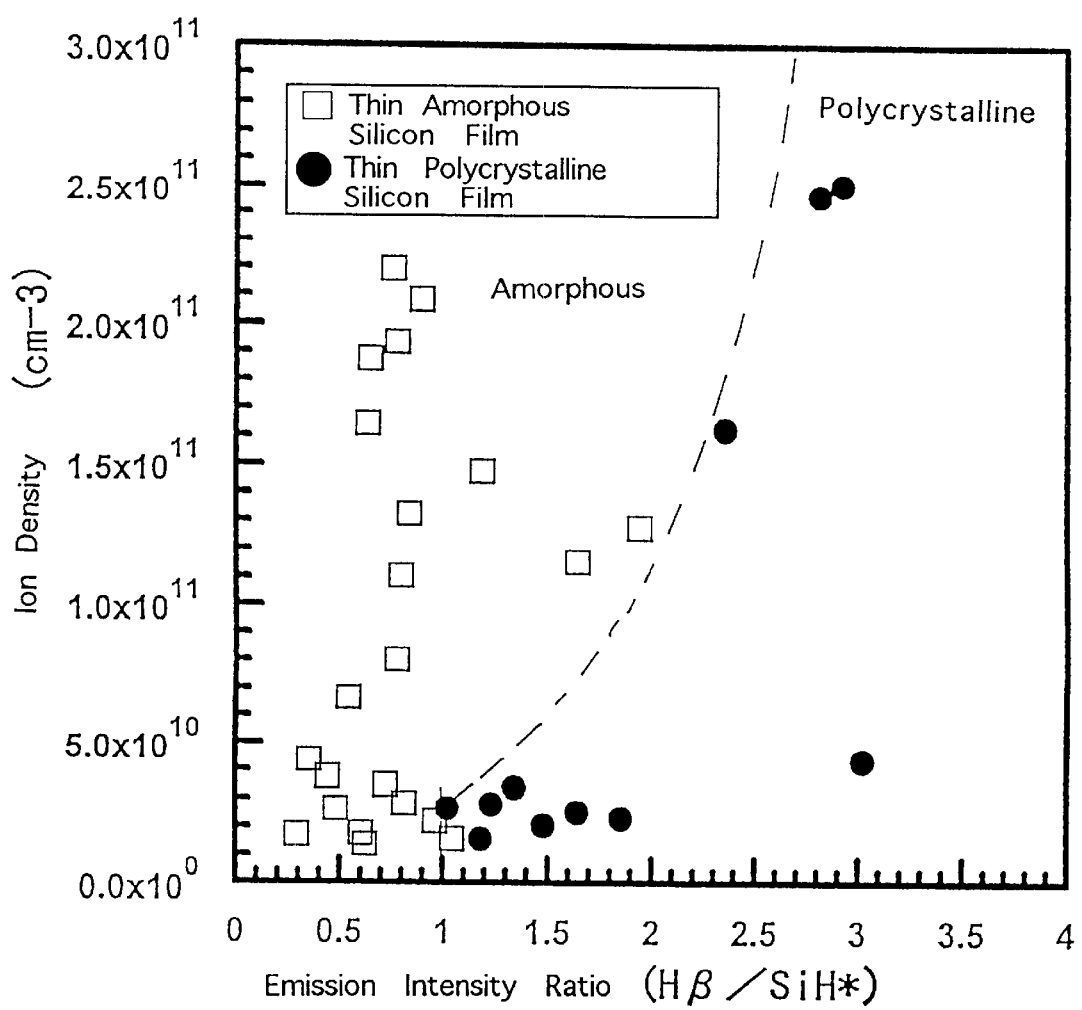
FIG. 4 shows relationship between states of plasma [emission intensity ratio (Hβ/SiH*) and ion density] and silicon crystallinity with different supplied gas volumes and discharging power values for film deposition in the experimental example 1.

FIG. 4 shows a relationship between the state of plasma [the emission intensity ratio (Hβ/SiH*) and the ion density] and the silicon crystallinity with various values of the gas supply amount and the discharging power for forming the film according to the experimental example 1. From FIG. 4, it is seen that the thin polycrystalline silicon film was obtained with the emission intensity ratio (Hβ/SiH*) of 1.0 or more regardless of the ion density, as shown by solid circles. When the emission intensity ratio (Hβ/SiH*) was smaller than 1.0, the thin amorphous silicon film was formed as shown by blank squares in FIG. 4. Increase in ion density impeded crystallization, and a higher emission intensity ratio (Hβ/SiH*) was required for crystallization. Therefore, it is understood that the ion density of $5 \times 10^{10}/cm^3$ or less is desired for efficiently obtaining a thin polycrystalline silicon film.

EXPERIMENTAL EXAMPLES 2 AND 3

In the experimental example 2, a thin silicon film was formed by the thin film forming apparatus shown in FIG. 1. In the experimental example 3, another thin silicon film was formed by the thin film forming apparatus shown in FIG. 2.
Deposition Conditions of Experimental Example 2

| | |
|---|---|
| Substrate | glass substrate |
| SiH$_4$ Supplied Amount | 5 sccm |
| Discharging Power | 60 MHz, 300 W |
| Substrate Temperature | 400° C. |
| Deposition Gas Pressure | 2 m Torr maintaining stable discharging |
| Deposited Film Thickness | 500Å |

Deposition Conditions of Experimental Example 3

| | |
|---|---|
| Substrate | glass substrate |
| SiH$_4$ Supplied Amount | 5 sccm |
| Discharging Power | 60 MHz, 300 W |
| Substrate Temperature | 400° C. |
| Deposition Gas Pressure | 150 mTorr maintaining stable discharging |
| Deposited Film Thickness | 500Å |

The crystallinity of the thin silicon films obtained in the experimental examples 2 and 3 were evaluated by the Raman spectroscopy. In the experimental example 2, formation of a thin polycrystalline silicon film was confirmed, and formation of a thin amorphous silicon film was confirmed in the experimental example 3. The emission intensity ratio (Hβ/SiH*) in the plasma was 1 or more in the experimental example 2, and was smaller than 1 in the experimental example 3.

EXPERIMENTAL EXAMPLES 4 AND 5

Experimental examples 4 and 5 were performed from a viewpoint of a frequency of the radio-frequency power.

In the experimental example 4, a thin silicon film was formed by the thin film forming apparatus shown in FIG. 1. In the experimental example 5, another thin silicon film was formed by a thin film forming apparatus shown in FIG. 1 with a replaced discharging power source 4 of 13.56 MHz and 300 W in this example.
Deposition Conditions of Experimental Example 4

| | |
|---|---|
| Substrate | glass substrate |
| SiH$_4$ Supplied Amount | 5 sccm |
| Discharging Power | 60 MHz, 300 W |
| Substrate Temperature | 400° C. |
| Deposition Gas Pressure | 2 m Torr |
| Deposited Film Thickness | 500Å |

Deposition Conditions of Experimental Example 5

| | |
|---|---|
| Substrate | glass substrate |
| SiH$_4$ Supplied Amount | 5 sccm |
| Discharging Power | 13.56 MHz, 300 W |
| Substrate Temperature | 400° C. |
| Deposition Gas Pressure | 2 m Torr |
| Deposited Film Thickness | 500Å |

The crystallinity of the thin silicon films obtained in the experimental examples 4 and 5 were evaluated by the Raman spectroscopy. In the experimental example 4, formation of a thin polycrystalline silicon film was confirmed, and formation of a thin amorphous silicon film was confirmed in the experimental example 5. The emission intensity ratio (Hβ/SiH*) in the plasma was 1 or more in the experimental example 4, but was smaller than 1 in the experimental example 5 due to the low discharging frequency of 13.56 MHz.

EXPERIMENTAL EXAMPLES 6 AND 7

Experimental examples 6 and 7 were performed from a viewpoint of the deposition gas pressure.

In either of the experimental examples 6 and 7, a thin silicon film was formed by the thin film forming apparatus shown in FIG. 1.
Deposition Conditions of Experimental Example 6

| | |
|---|---|
| Substrate | glass substrate |
| SiH$_4$ Supplied Amount | 5 sccm |
| Discharging Power | 60 MHz, 300 W |
| Substrate Temperature | 400° C. |
| Deposition Gas Pressure | 2 m Torr |
| Deposited Film Thickness | 500Å |

Deposition Conditions of Experimental Example 7

| | |
|---|---|
| Substrate | glass substrate |
| SiH$_4$ Supplied Amount | 5 sccm |
| Discharging Power | 60 MHz, 300 W |
| Substrate Temperature | 400° C. |
| Deposition Gas Pressure | 50 m Torr |
| Deposited film Thickness | 500Å |

The crystallinity of the thin silicon films obtained in the experimental examples 6 and 7 were evaluated by the Raman spectroscopy. In the experimental example 6, formation of a thin polycrystalline silicon film was confirmed, and formation of a thin amorphous silicon film was confirmed in the experimental example 7. The emission intensity ratio (Hβ/SiH*) in the plasma was 1 or more in the experimental example 6, but was smaller than 1 in the experimental example 7 due to the high deposition pressure of 50 m Torr. Further, the ion density of the plasma in the experimental example 7 was higher than that in the experimental example 6.

EXPERIMENTAL EXAMPLE 8

A thin silicon film was formed by the apparatus shown in FIG. 2.

Deposition conditions are as follows:

| | |
|---|---|
| Substrate | Non-alkali glass substrate and Si-Wafer <100> |
| SiH$_4$ Supplied Amount | 30 sccm |

-continued

| | |
|---|---|
| Discharging Power | 60 MHz, 800 W |
| Hβ/SiH* | 2.5 |
| Plasma Potential | 45 V |
| Electron Temperature | 2.3 eV |
| Deposition Gas Pressure | $1 \times 10^{-3}$ Torr |
| Substrate Temperature | 400° C. |
| Deposited Film Thickness | 500Å |

The hydrogen concentration and the crystallinity of the thin silicon films thus produced were evaluated by FT-IR (Fourier Transform Infrared Spectroscopy) and the laser Raman spectroscopy.

Regarding the FT-IR, the hydrogen concentration of the film was quantitatively determined from the Si-H (Stretching-band) absorption peak integrated intensity of 2000 cm$^{-1}$. The determined value was $5 \times 10^{20}$ cm$^{-3}$ or less, which was significantly reduced and improved as compared with a value of $2 \times 10^{22}$ cm$^{-3}$ exhibited by a conventional specimen (amorphous silicon film).

Figure 5:
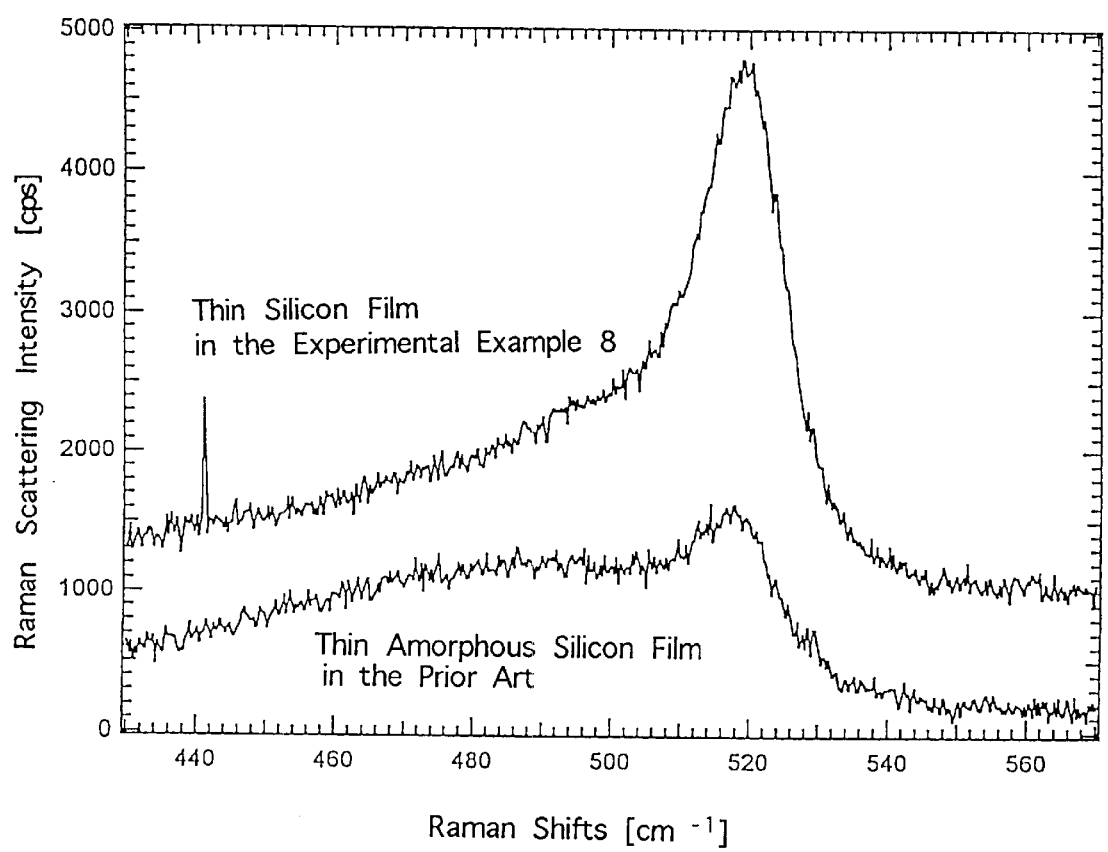
FIG. 5 shows relationship between Raman shift and Raman scattering intensity obtained from laser Raman spectroscopy of a thin silicon film in the experimental example 8 and also of a thin amorphous silicon film in the prior art.

FIG. 5 shows a relationship between a Raman shift and a Raman scattering intensity by a laser Raman method of the thin silicon film formed in the experimental example 8 and of a thin amorphous silicon film in the prior art.

According to the result of the crystallinity evaluation in the Raman spectroscopy, a peak (Raman shift=515–520 cm$^{-1}$) of the crystallized silicon was detected to the conventional specimen (amorphous silicon structure, Raman shift=480 cm$^{-1}$), and the crystallinity of the thin silicon film was confirmed. Presence of crystal grains of 100 Å–2000 Å in diameter was confirmed.

In addition to the experimental example 8 described above, thin silicon films were formed in such manners that various different values of plasma control parameters, namely, discharging power, supplied gas flow rate and deposition gas pressure, were employed in the experimental example 8, but Hβ/SiH* of 1 or more and the plasma potential not exceeding 60 V were maintained. In any one of the cases, the values of FT-IR were significantly reduced and improved as compared with $2 \times 10^{22}$ cm$^{-3}$ of the conventional specimen (amorphous silicon film) Further, presence of a thin polycrystalline silicon film was confirmed according to the Raman spectroscopy.

Further another example of the thin film forming apparatus according to the invention is described with reference to FIG. 6.

Figure 6:
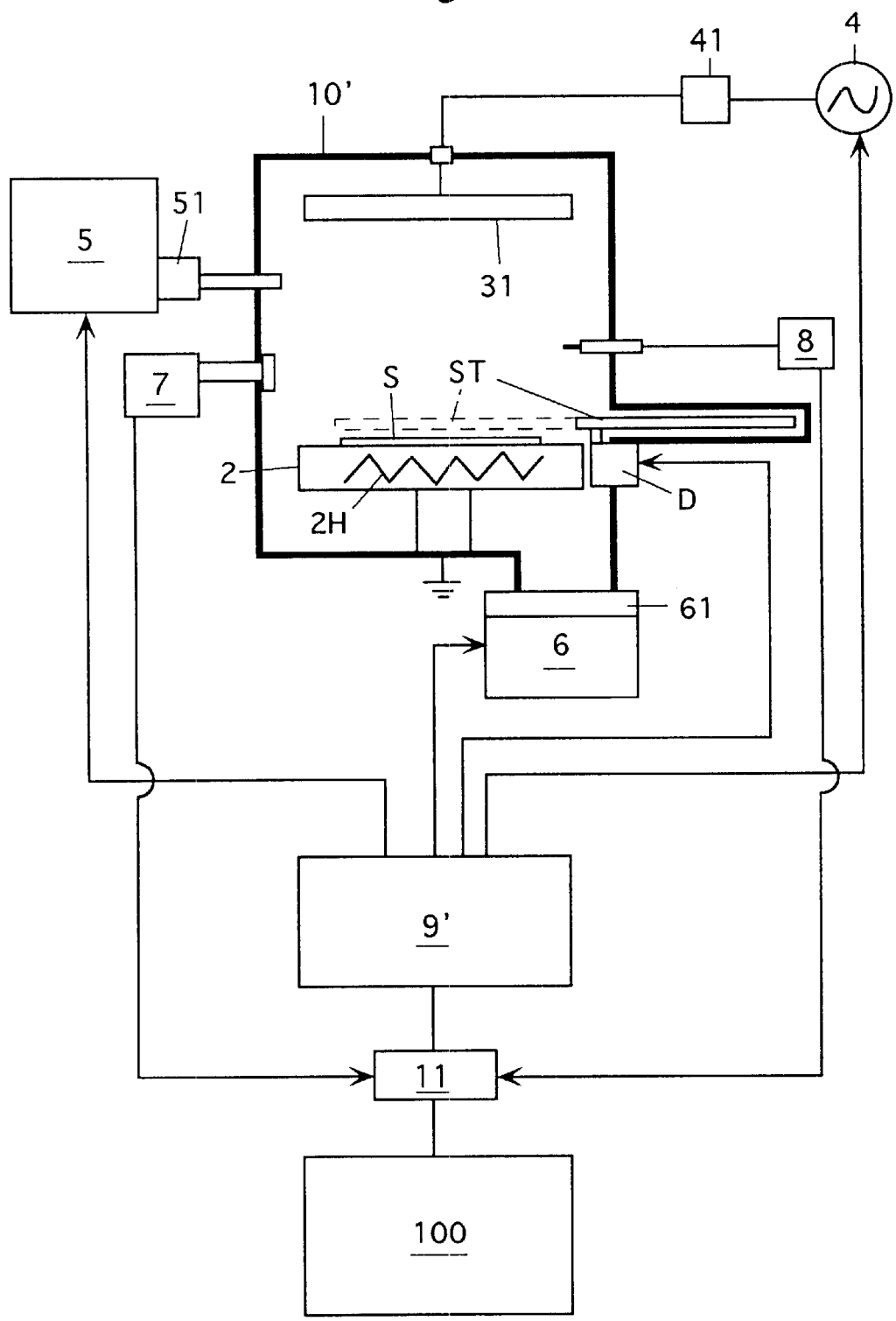
FIG. 6 shows a schematic structure of another example of the thin film forming apparatus according to the invention.

The thin film forming apparatus in FIG. 6 is a plasma CVD device of a parallel plated electrode structure substantially same as the thin film forming apparatus in FIG. 2. The apparatus in FIG. 6 includes a deposition chamber (plasma producing chamber) 10', the substrate holder 2 which is disposed in the chamber 10', is kept at the ground potential and is provided with the heater 2H, the plate-type discharging electrode 31 disposed in the chamber and located above the substrate holder 2, the discharging radio-frequency power source 4 connected to the discharging electrode 31 via the matching box 41, the gas supply device 5 for supplying a gas for film deposition into the deposition chamber, the exhaust device 6 connected to the deposition chamber for exhausting the gas from the deposition chamber, the emission-spectrometer 7 and the probe measuring device 8 for measuring a state of a plasma formed in the deposition chamber, and the control portion 9' which controls power supplied from the power source 4, the gas supply from the gas supply device 5 or the deposition pressure (deposition gas pressure) in the deposition chamber based on information detected at the emission-spectrometer 7 and the probe measuring device 8 for obtaining a predetermined plasma state. The apparatus is also provided with a substrate shutter ST which is driven by a drive portion D between a position for covering the substrate S disposed on the holder 2 and an escaped position exposing the substrate S. All of these components operate in accordance with instructions from the host computer 100. In the figure, "11" indicates the intermediate hub device for governing the transmission and reception of the signals.

The power source 4 is a variable power source controlled by an instruction from the control portion 9', and can supply a radio-frequency power of a frequency of 60 MHz.

The gas supply device 5 in this embodiment is to supply mono-silane (SiH$_4$) gas, and includes, e.g., a gas source of SiH$_4$ as well as a valve (not shown), a mass-flow controller 51, which controls an amount of the gas supplied to the deposition chamber 10' by controlling the flow rate in accordance with an instruction from the control portion 9'.

The exhaust device 6 includes, e.g., an exhausting pump as well as a valve 61 (a conductance valve in this example) for controlling an exhausting rate or amount in accordance with an instruction from the control portion 9', and thereby controlling the deposition pressure (deposition gas pressure) in the deposition chamber 10'.

The shutter drive portion D drives the shutter in accordance with an instruction from the control portion 9'.

The emission-spectrometer 7 is similar to the emission-spectrometer shown in FIGS. 1 and 2, can detect emission spectra of products from gas decomposition, and includes a memory for storing detected emission intensities of SiH* radicals and hydrogen atom radicals (Hβ), and an operating portion for obtaining the emission intensity ratio (Hβ/SiH*) by arithmetic operations from the respective emission intensities stored in the memory.

In this example, Hβ/SiH* is likewise obtained by the following formula in view of the sensitivity calibration of the device: Emission intensity ratio (Hβ/SiH*)=(Ib×αb)/(Ia×αa)

The probe measuring device 8 is a device for measuring a plasma state by a Langmuir probe similarly to the probe measuring devices shown in FIGS. 1 and 2, and includes an operating portion for obtaining a plasma potential from probe-measured data by arithmetic operations.

In the thin film forming apparatus shown in FIG. 6, the deposition target substrate S is disposed on the substrate holder 2 in the deposition chamber 10', and is initially covered with the shutter ST. If necessary, it is heated to a predetermined temperature, and the exhaust device 6 operates to exhaust the gas from the deposition chamber. At the same time, the gas supply device 5 supplies a mono-silane gas into the deposition chamber, and discharging from the discharging electrode 31 is performed so that a plasma is produced from the gas. The control portion 9' performs the control as follows.

Figure 7:
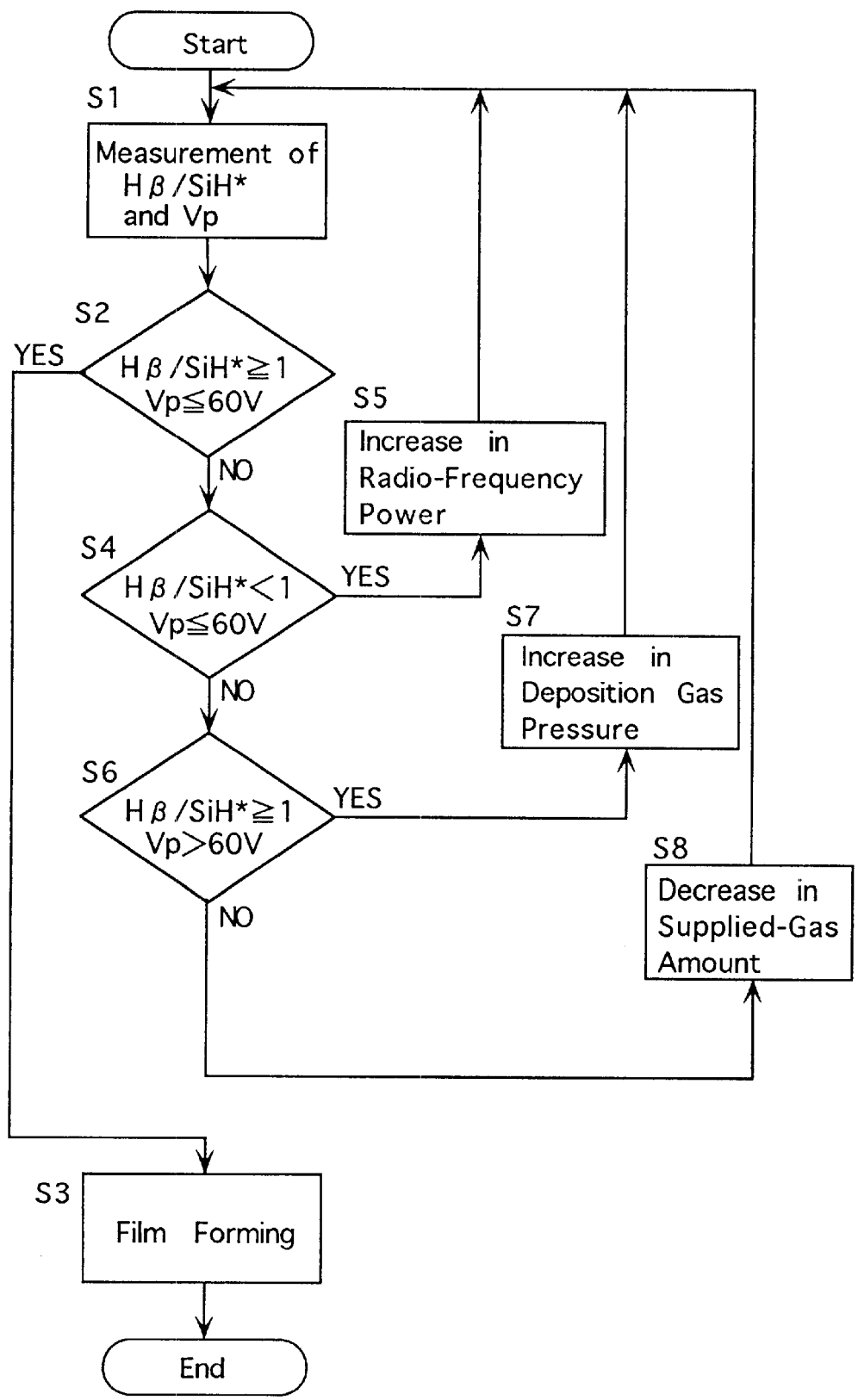
FIG. 7 is a flowchart showing operations of a control portion in the thin film forming apparatus shown in FIG. 6.

As shown in the flowchart of FIG. 7, the control portion 9' reads the emission intensity ratio (Hβ/SiH*) obtained by the emission-spectrometer 7, and also reads the plasma potential Vp detected by the probe measuring device 8 (step S1).

Further, the control portion 9' determines whether the conditions of (Hβ/SiH*)≧1 and Vp≦60 V are satisfied (step S2). When satisfied, the control portion 9' moves the shutter ST to expose the substrate S by sending an instruction to the drive portion D, and starts the deposition (step S3).

When the foregoing conditions are not satisfied, operations are performed in the following order.

First, it is determined whether the conditions of (Hβ/SiH*)<1 and Vp≦60 V are satisfied or not (step S4).

If YES, the output (wattage) of the power source 4 is increased by a predetermined magnitude (step S5).

If NO, it is determined whether the conditions of (Hβ/SiH*)≧1 and Vp>60 V are satisfied or not (step S6). If YES, the exhaust regulating valve 61 of the exhaust device 6 is operated to increase the gas pressure in the deposition chamber 10' by a predetermined amount (step S7). When NO, the conditions of (Hβ/SiH*)<1 and Vp>60 V are present so that the mass-flow controller 51 of the gas supply device 5 is operated to decrease the gas supply amount by a predetermined amount (step S8).

After increasing the power output, the deposition chamber gas pressure or the gas supply amount by a predetermined degree or amount in the step S5, S7 or S8, the process returns to the step S1 for reading detected information from devices 7 and 8, and it is determined whether the detected information satisfies the conditions of (Hβ/SiH*)≧1 and Vp≦60 V. If necessary, similar steps are repeated.

When the conditions of (Hβ/SiH*)≧1 and Vp≦60 V are satisfied in the above manner, the drive portion D is instructed to move the shutter ST. Thereby, the substrate S is exposed, and deposition starts.

Through the above steps, a thin polycrystalline silicon film can be formed with high productivity on the substrate S at the substrate temperature of 400° C. or less.

For forming a thin polycrystalline silicon film of high quality more smoothly, the device shown in FIG. 6 may be arranged as follows;

(a) For achieving the ion density of the plasma not exceeding $5 \times 10^{10}$ (cm$^{-3}$), the control portion 9' may control at least one of the magnitude of the supplied power from the discharging power source 4, the amount of the gas supplied from the gas supply device 5 and the deposition pressure, which can be controlled by controlling the supplied gas amount and/or the exhausted gas amount by the exhaust device 6.

(b) The control portion 9 may control the supplied gas amount from the gas supply device 5 and/or the exhausted gas amount by the exhaust device 6 so that the deposition gas pressure may not exceed 20 m Torr, and more preferably 10 m Torr.

By using the thin film forming apparatus shown in FIG. 6, a thin polycrystalline silicon film of high quality was formed on the same substrate as that in the foregoing experimental example 8 by setting substantially the same conditions as the experimental example 8.

Industrial Applicability

The invention can be applied to forming thin polycrystalline silicon films on processing target objects such as a display substrate of a liquid crystal display, substrates of various integrated circuits and a substrate of a solar battery by a plasma CVD method.

What is claimed is:

1. A thin polycrystalline silicon film forming method, in which a plasma is formed from a gas mixture of a material gas having silicon atoms and a hydrogen gas, or from a silane-containing reaction gas, the state of said plasma is controlled to provide an emission intensity of hydrogen atom radicals (Hβ) in the plasma exhibiting a ratio of one or more to an emission intensity of SiH* radicals, and a thin polycrystalline silicon film is formed on a substrate in the plasma.

2. The method of forming a thin polycrystalline silicon film according to claim 1; wherein
a substrate temperature is kept at 400° C. or less during deposition.

3. The method of forming a thin polycrystalline silicon film according to claim 1, wherein
said plasma state is controlled to provide an ion density of $5 \times 10^{10}$ (cm$^{-3}$) or less for forming the thin polycrystalline silicon film.

4. The method of forming a thin polycrystalline silicon film according to claim 1, wherein
said plasma is formed by discharging, and a discharging electrode used for discharging is a cylindrical electrode.

5. The method of forming a thin polycrystalline silicon film according to claim 1, wherein
said plasma is formed by discharging, and a discharging power source used for discharging is a radio-frequency power source of a frequency of 60 MHz or more.

6. The method of forming a thin polycrystalline silicon film according to claim 1, wherein
a deposition gas pressure is kept at 20 m Torr or less.

7. The method of forming a thin polycrystalline silicon film according to claim 1, wherein
said plasma is controlled to provide a plasma potential of 60 V or less.

8. The method of forming a thin polycrystalline silicon film according to claim 7 wherein
for forming a thin polycrystalline silicon film on said substrate, said substrate is disposed in the deposition chamber, the internal pressure of said deposition chamber is lowered to the deposition gas pressure by exhausting the gas therefrom, and said plasma is formed by applying a radio-frequency power to the deposition material gas supplied into the deposition chamber, formed of the gas mixture of the material gas having the silicon atoms and the hydrogen gas, or the silane-containing reaction gas;
when said emission intensity ratio is smaller than 1, and said plasma potential is equal to 60 V or less, said radio-frequency power is increased;
when said emission intensity ratio is 1 or more, and said plasma potential is larger than 60 V, the exhausting amount of the gas from the deposition chamber is adjusted to increase said deposition gas pressure;
when said emission intensity ratio is smaller than 1, and said plasma potential is larger than 60 V, the amount of said material gas supplied into said deposition chamber is reduced,
thereby the conditions of the emission intensity ratio of 1 or more and the plasma potential of 60 V or less are set.

9. The method of forming a thin polycrystalline silicon film according to claim 8, wherein
said plasma state is controlled to provide the ion density of the plasma equal to $5 \times 10^{10}$ (cm$^{-3}$) or less for forming the thin polycrystalline silicon film.

10. The method of forming a thin polycrystalline silicon film according to claim 8, wherein
a cylindrical discharging electrode connected to a radio-frequency power source is employed for applying said radio-frequency power to said deposition material gas.

11. The method of forming a thin polycrystalline silicon film according to claim 8, wherein
a radio-frequency power of a frequency of 60 MHz or more is used as said radio-frequency power applied to said deposition material gas.

12. The method of forming a thin polycrystalline silicon film according to claim 8, wherein
the deposition gas pressure is kept at 20 m Torr or less.

13. The method of forming a thin polycrystalline silicon film according to claim 8, wherein
the substrate temperature is kept at 400° C. or less during deposition.

* * * * *